(12) United States Patent
Qian (10) Patent No.: US 9,029,948 B2
(45) Date of Patent: May 12, 2015

(54) LDMOS DEVICE WITH STEP-LIKE DRIFT REGION AND FABRICATION METHOD THEREOF

(71) Applicant: Shanghai Hua Hong NEC Electronics Co., Ltd, Shanghai (CN)

(72) Inventor: Wensheng Qian, Shanghai (CN)

(73) Assignee: Shanghai Hua Hong NEC Electronics Co., Ltd., Shanghai (CN)

( * ) Notice: Subject to any disclaimer, the term of this patent is extended or adjusted under 35 U.S.C. 154(b) by 0 days.

(21) Appl. No.: 13/947,604

(22) Filed: Jul. 22, 2013

(65) Prior Publication Data
US 2014/0027850 A1    Jan. 30, 2014

(30) Foreign Application Priority Data

Jul. 27, 2012  (CN) .......................... 2012 1 0264945

(51) Int. Cl.
*H01L 29/78* (2006.01)
*H01L 29/66* (2006.01)
*H01L 29/06* (2006.01)
*H01L 29/08* (2006.01)

(52) U.S. Cl.
CPC .......... *H01L 29/78* (2013.01); *H01L 29/66681* (2013.01); *H01L 29/66659* (2013.01); *H01L 29/7835* (2013.01); *H01L 29/0661* (2013.01); *H01L 29/0847* (2013.01)

(58) Field of Classification Search
CPC ............... H01I 29/0696; H01I 29/0847; H01I 29/42368; H01I 29/66659; H01I 29/7835; H01L 29/66659; H01L 29/7835; H01L 29/26586; H01L 29/1045; H01L 29/0847
USPC ........................................... 257/343; 438/286
See application file for complete search history.

(56) References Cited

U.S. PATENT DOCUMENTS 7,531,875 B2 *  5/2009  Udrea et al. .................. 257/343

\* cited by examiner

*Primary Examiner* — Monica D Harrison
(74) *Attorney, Agent, or Firm* — MKG, LLC (57) ABSTRACT

An LDMOS device is disclosed. The LDMOS device includes: a substrate having a first type of conductivity; a drift region having a second type of conductivity and being formed in the substrate; a doped region having the first type of conductivity and being formed in the substrate, the doped region being located at a first end of the drift region and laterally adjacent to the drift region; and a heavily doped drain region having the second type of conductivity and being formed in the substrate, the heavily doped drain region being located at a second end of the drift region, wherein the drift region has a step-like top surface with at least two step portions, and wherein a height of the at least two step portions decreases progressively in a direction from the doped region to the drain region. A method of fabricating LDMOS device is also disclosed.

16 Claims, 6 Drawing Sheets

LDMOS DEVICE WITH STEP-LIKE DRIFT REGION AND FABRICATION METHOD THEREOF

CROSS-REFERENCES TO RELATED APPLICATIONS

This application claims the priority of Chinese patent application number 201210264945.5, filed on Jul. 27, 2012, the entire contents of which are incorporated herein by reference.

TECHNICAL FIELD

The present invention relates in general to laterally diffused metal oxide semiconductor (LDMOS) devices, and more particularly, to an LDMOS device with a step-like drift region and a fabrication method thereof.

BACKGROUND

Laterally diffused metal oxide semiconductor (LDMOS) transistors are often used as power switch devices.

Figure 1A:
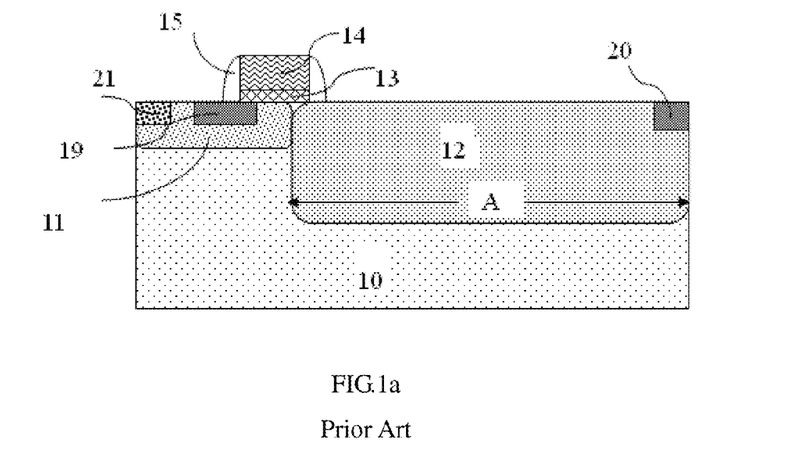
FIG. 1a shows a schematic illustration of a vertical cross section of an existing n-type LDMOS device.

FIG. 1a is a schematic illustration of an existing n-type LDMOS device. The device includes a p-type doped region 11 and an n-type drift region 12, laterally neighboring each other and both formed in a p-type substrate (or epitaxial layer) 10. The n-type drift region 12 has a planar top surface. A heavily doped n-type source region 19 is formed in a central portion of the p-type doped region 11. A gate oxide layer 13 has its one end on the n-type drift region 12, the other end on the heavily doped n-type source region 19, and the rest portion on the p-type doped region 11. A gate 14 is located on the gate oxide layer 13. Sidewalls 15 are formed on both sides of the gate oxide layer 13 and the gate 14. A heavily doped n-type drain region 20 is formed at one end of the n-type drift region 12 farther from the p-type doped region 11. A p-type heavily doped pick-up region 21 is formed at one end of the p-type doped region 11 farther from the n-type drift region 12. A channel of the LDMOS device is formed in a portion of the p-type doped region 11 under the gate oxide layer 13. A p-type LDMOS device has a similar architecture to the n-type LDMOS device discussed above expect that all components of the p-type LDMOS device have conductivity types opposite to their counterparts in the n-type LDMOS device.

Figure 1B:
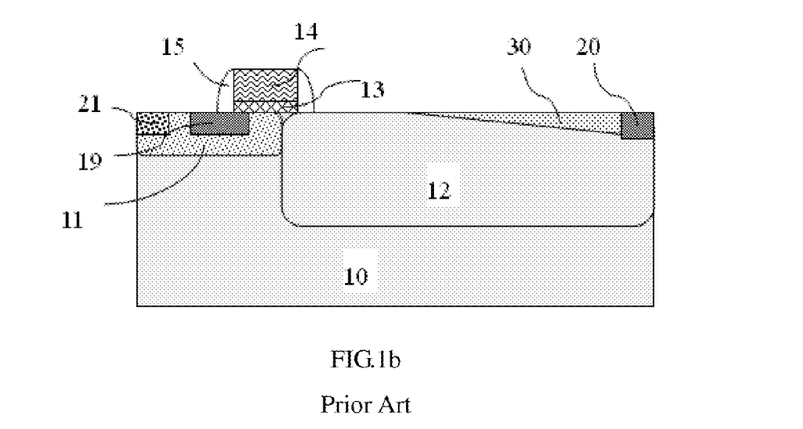
FIG. 1b shows a diagram schematically illustrating the charge distribution in a depletion region of the LDMOS device of FIG. 1a when a high voltage is applied to a drain region of the device.

When a high voltage is applied to the drain region 20 of the existing n-type LDMOS device shown in FIG. 1a, the channel of the device will cause a depletion region horizontally extend towards the drain region 20. Moreover, a PN junction formed between the n-type drift region 12 and the p-type substrate 10 will cause the depletion region vertically extend towards the p-type substrate 10. As both the horizontal and vertical dimensions of the depletion region are determined by, and reversely proportional to, the doping concentration of the drift region 12, a heavily doped drift region 12 will not be completely depleted even upon the occurrence of the device's avalanche breakdown. As shown in FIG. 1b, a triangular region 30 proximate the drain region 20 and under the top surface of the drift region 12 is not depleted after the avalanche breakdown of the device. The existence of this triangular region 30 causes the effective length of the drift region to be smaller than the physical length (i.e., the length A shown in FIG. 1a) of the drift region, thereby centralizing electric field in the drift region 12 and creating an intensively high electric field therein, which lead to a reduced breakdown voltage of the device.

The above-mentioned device is a non-channel-isolated LDMOS transistor, which may be modified into a channel-isolated n-type LDMOS transistor by including an n-type well in the p-type substrate 10, encircling both the p-type doped region 11 and the n-type drift region 12. Similarly, a channel-isolated p-type LDMOS device can be obtained by converting the conductivity types of all components of the channel-isolated n-type LDMOS device to respective opposite types of conductivity.

In order to reduce power consumption, an LDMOS device is typically required to have an on-resistance as low as possible. Thus, during the design of the device, it is contemplated to reduce the physical length of the drift region (i.e., the length A shown in FIG. 1a) to a possible minimum and/or to increase the doping concentration of the drift region, so as to reduce the series resistance of the drift region. However, on the other hand, as all LDMOS devices are high-voltage devices and the value of the breakdown voltage is an important characteristic parameter, the LDMOS devices are also required to have a high breakdown voltage by owning a relatively great drift region length and a low drift region doping concentration. Thus, it is obvious that the on-resistance and the breakdown voltage have to be compromised. It is difficult for an existing LDMOS device to have both a low on-resistance and a high breakdown voltage.

SUMMARY OF THE INVENTION

The present invention is directed to the provision of an LDMOS device with a completely novel structure, which is capable of having both a low on-resistance and a high breakdown voltage.

To achieve the above objective, the present invention provides an LDMOS device including: a substrate having a first type of conductivity; a drift region having a second type of conductivity and being formed in the substrate; a doped region having the first type of conductivity and being formed in the substrate, the doped region being located at a first end of the drift region and laterally adjacent to the drift region; and a heavily doped drain region having the second type of conductivity and being formed in the substrate, the heavily doped drain region being located at a second end of the drift region, wherein the drift region has a step-like top surface with at least two step portions, and wherein a height of the at least two step portions decreases progressively in a direction from the doped region to the drain region.

Optionally, the first and second types of conductivity are p-type and n-type, respectively, or n-type and p-type, respectively.

Optionally, an outer edge of a lowest step portion of the drift region is aligned with an inner side of the drain region, wherein a top surface of a highest step portion of the drift region is at a same level with a top surface of the drain region, and wherein a top surface of the lowest step portion of the drift region is at a same level with or at a higher level than a bottom surface of the drain region.

Optionally, an outer edge of a lowest step portion of the drift region is aligned with an outer side of the drain region, and wherein a top surface of the lowest step portion of the drift region is at a same level with a top surface of the drain region.

Optionally, the LDMOS device further includes: a gate oxide layer and a gate both on a top surface of the substrate, the gate oxide layer covering a portion of the drift region and a portion of the doped region; sidewalls on both sides of the gate oxide layer and the gate; and a heavily doped source region having the second type of conductivity and a heavily doped channel pick-up region having the first type of conductivity both formed in the doped region, the heavily doped channel pick-up region being located at an end of the source region farther from the drift region.

Optionally, a border line between the highest and the second highest step portions of the drift region may be aligned with, or a certain distance away from, an outer side face of the sidewall closer to the drift region.

Optionally, in the LDMOS device, a doping concentration of the drift region is proportional to a distance from a border line between a highest and a second highest step portions of the drift region to the drain region and is also proportional to a height difference between the highest and a lowest step portions of the drift region.

The present invention also provides a method of fabricating an LDMOS device, including the steps of: providing a substrate having a first type of conductivity; forming a drift region having a second type of conductivity in the substrate; forming a doped region having the first type of conductivity in the substrate, the doped region being located at a first end of the drift region and laterally adjacent to the drift region; and forming a heavily doped drain region having the second type of conductivity in the substrate, the heavily doped drain region being located at a second end of the drift region, wherein the drift region has a step-like top surface with at least two step portions, and wherein a height of the at least two step portions decreases progressively in a direction from the doped region to the drain region.

Optionally, the method may include the steps of: 1) forming, in a substrate having the first type of conductivity, a doped region having the first type of conductivity and a drift region having the second type of conductivity which are laterally adjacent to each other; 2) successively forming a gate oxide layer and a polysilicon gate on a top surface of the substrate, the gate oxide layer covering a portion of the drift region and a portion of the doped region; 3) performing at least one etching process on the drift region to make the drift region have a step-like top surface; 4) forming a heavily doped source region having the second type of conductivity in a central portion of the doped region; 5) forming a heavily doped drain region having the second type of conductivity at an end of the drift region farther from the gate oxide layer; and 6) forming a heavily doped channel pick-up region having the first type of conductivity at an end of the doped region farther from the gate oxide layer.

Optionally, in the method, the first and second types of conductivity are p-type and n-type, respectively, or n-type and p-type, respectively.

Optionally, in the step 1), multiple ion implantation and annealing processes may be carried out to create a dopant concentration gradient in the drift region decreasing from the top down.

Optionally, the method may further include forming a well having the second type of conductivity in the substrate before the step 1), and in the step 1), the doped region having the first type of conductivity and the drift region having the second type of conductivity are both formed in the well.

Optionally, the drift region may have a dopant concentration ranged from $1\times10^{16}$ atoms/cm$^3$ to $1\times10^{18}$ atoms/cm$^3$, and both the heavily doped source region and the heavily doped drain region have a dopant concentration of greater than $1\times10^{20}$ atoms/cm$^3$.

Optionally, the method may further include, between the steps 2) and 3), forming sidewalls on both sides of the gate oxide layer and the polysilicon gate.

Optionally, a border line between a highest and a second highest step portions of the drift region formed by the at least one etching process in the step 3) is aligned with an outer side face of the sidewall closer to the drift region.

Optionally, the method may further include, between the steps 3) and 4), forming sidewalls on both sides of the gate oxide layer and the polysilicon gate such that an outer side face of the sidewall closer to the drift region is aligned with, or a certain distance away from, a border line between a highest and a second highest step portions of the drift region.

As the step-like drift region of the LDMOS device of the present invention has a thickness progressively decreasing from the channel towards the drain region, the drift region is easier to be completely depleted and hence can withstand a higher breakdown voltage. Meanwhile, the progressively decreasing thickness also allows an increase of the doping concentration of the drift region, thereby greatly reducing its on-resistance. Thus, the LDMOS device of the present invention can have both a low on-resistance and a high breakdown voltage, and therefore has an improved performance compared with the existing device.

DETAILED DESCRIPTION OF THE INVENTION

Figure 2A:
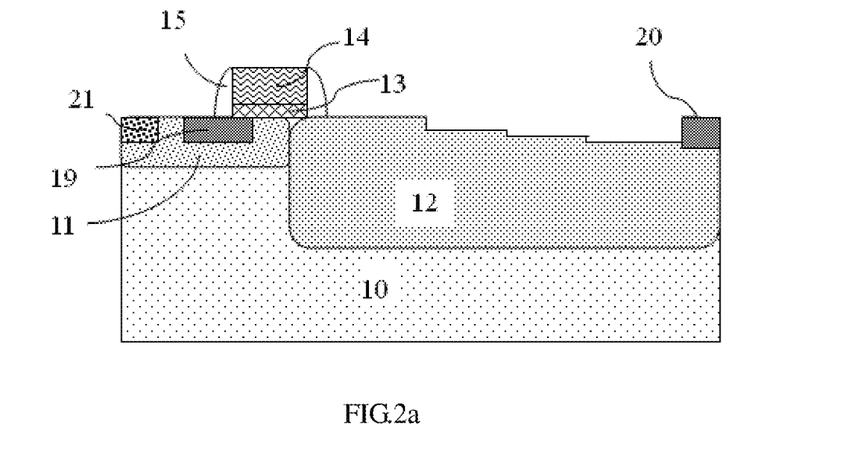
FIG. 2a shows a schematic illustration of a vertical cross section of an n-type LDMOS device embodying the present invention.

FIG. 2a schematically illustrates an LDMOS device with a step-like drift region embodying the present invention. It differs from an existing LDMOS device in that a drift region 12 of the LDMOS device of the present invention has a step-like top surface and a thickness progressively decreasing from a channel towards a drain region 12. Such design enables the drift region 12 to be completely depleted during the operation of the LDMOS device of the present invention. The above-mentioned channel refers to a portion of a p-type doped region 11 that is under and in close proximity to a gate oxide layer 13, as shown in FIG. 2a.

The LDMOS device shown in FIG. 2a is a non-channel-isolated n-type LDMOS device. A non-channel-isolated p-type LDMOS device with such structure can be obtained by converting the conductivity types of all components of the non-channel-isolated n-type LDMOS device to respective opposite types of conductivity.

Moreover, the above-mentioned non-channel-isolated n-type LDMOS device of FIG. 2a may be modified into a channel-isolated n-type LDMOS device by including an n-type well in the p-type substrate 10, encircling both the p-type doped region 11 and the n-type drift region 12. Similarly, a channel-isolated p-type LDMOS device can be obtained by converting the conductivity types of all components of the channel-isolated n-type LDMOS device to respective opposite types of conductivity.

Figure 4A:
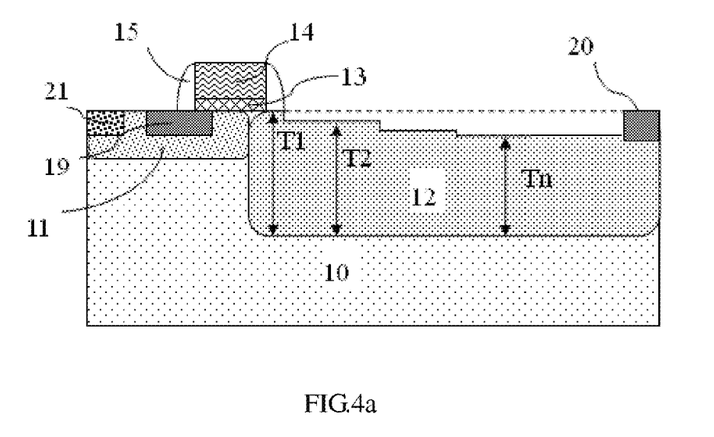
FIGS. 4a and 4b show schematic illustrations of embodiments of step-like drift regions of LDMOS devices constructed in accordance with the present invention.
Figure 4B:
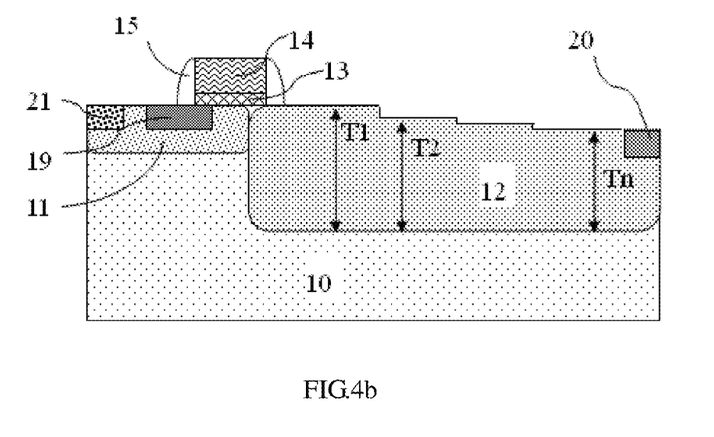

In one embodiment, as shown in FIG. 4a, the highest step portion of the drift region 12 having a greatest thickness T1 and the second highest step portion of the drift region 12 having a second greatest thickness T2 are just bordered at an outer side face (i.e., the side face farther from the gate oxide layer 13) of a sidewall 15 above the drift region 12. In another embodiment, as shown in FIG. 4b, the border line between the highest and second highest step portions is a certain distance away from the sidewall 15 (i.e., the highest step portion may further extend a certain distance away from the gate oxide layer 13).

In one embodiment, with further reference to FIG. 4a, the outer edge of the lowest step portion of the drift region 12 having a smallest thickness Tn, may be just at an inner side (i.e., the side of nearer to the gate oxide layer 13) of a drain region 20. Meanwhile, a top surface of the highest step portion of the drift region 12 (where the thickness of drift region 12 is T1) is at the same level with a top surface of the drain region 20, and a top surface of the lowest step portion of the drift region 12 (where the thickness of drift region 12 is Tn) is at the same level with or at a higher level than a bottom surface of the drain region 20. In another embodiment, with further reference to FIG. 4b, the outer edge of the lowest step portion of the drift region 12 is just at the inner side of the drain region 20, and the top surface of the lowest step portion of the drift region 12 is at the same level with the top surface of the drain region 20.

Moreover, in specific embodiments of the present invention, the higher a doping concentration of the drift region 12, the greater the distance from the border line between the highest and the second highest step portions of the drift region 12 to the drain region 20 and the greater the difference between the greatest thickness T1 and the smallest thickness Tn of the drift region 12, and vice versa.

Figure 2B:
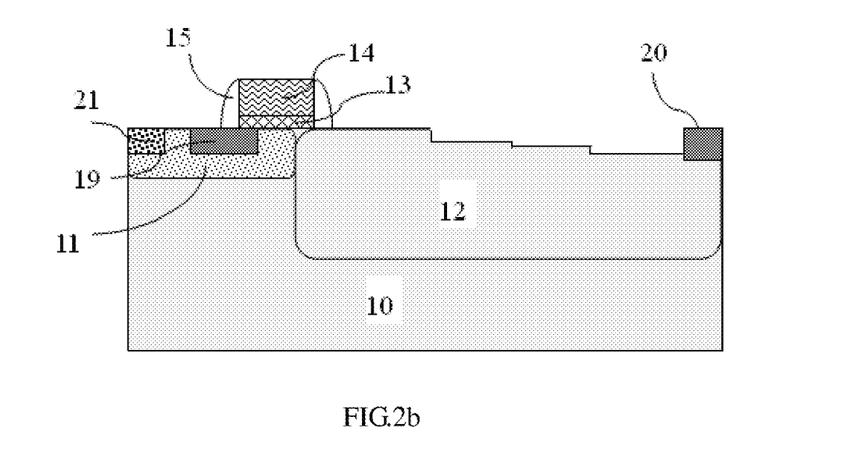
FIG. 2b shows a diagram schematically illustrating the charge distribution in a depletion region of the LDMOS device of FIG. 2a when a high voltage is applied to a drain region of the device.

The progressively decreasing thickness from the channel towards the drain region of the step-like drift region of the LDMOS device of the present invention enables a portion of the drift region, which is more proximate to the channel and is hence easier to be depleted, to have a greater thickness and a portion, which is farther from the channel and is thus more difficult to be depleted, to have a smaller thickness. As such, regardless of how high the doping concentration of the drift region is, the drift region may be always completely depleted, as shown in FIG. 2b, during the operation of the LDMOS device, thereby resulting in an improvement of the breakdown voltage of the LDMOS device of the present invention. Moreover, as the lower the doping concentration of the drift region, the greater the size of the depletion region is, in light of that even a heavily doped drift region may be completely depleted, a lightly doped drift region may be surely depleted completely. Furthermore, the step-like drift region allows the doping concentration to be appropriately increased so as to further reduce the on-resistance of the LDMOS device.

In one exemplary embodiment, the non-channel-isolated n-type LDMOS device shown in FIG. 2a may be fabricated by a method described below.

Figure 3A:
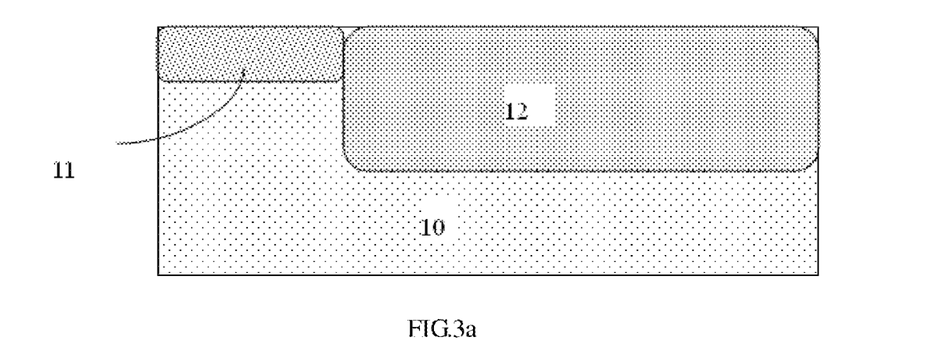
FIGS. 3a to 3f show schematic illustrations of device structures after steps of a method for fabricating an n-type LDMOS device (non-channel-isolated) in accordance with an embodiment of the present invention.

Turning now to FIG. 3a, in a first step of the method, a p-type doped region 11 and an n-type drift region 12 adjacent to each other are formed, by ion implantation, in a p-type substrate 10. Next, multiple ion implantation and annealing processes are carried out to form a dopant concentration gradient in the drift region 12 decreasing from the top down. The dopant concentration gradient enables the LDMOS device being fabricated to have a low on-resistance and facilitates the drift region to be completely depleted to achieve a high breakdown voltage of the device. Preferably, the drift region has a dopant concentration of $1 \times 10^{16}$ atoms/cm$^3$ to $1 \times 10^{18}$ atoms/cm$^3$.

Figure 3B:
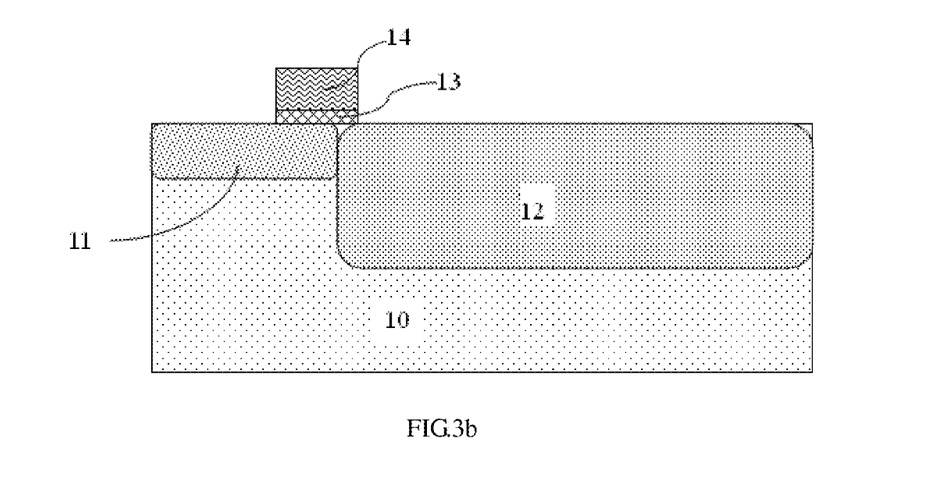

In a second step, as shown in FIG. 3b, a silicon oxide layer is thermally grown or deposited over the substrate, and a polysilicon layer is further deposited over the silicon oxide. Next, etching and photolithography processes are performed on the silicon oxide layer and the polysilicon layer to form a gate oxide layer 13 and a polysilicon gate 14 on the gate oxide layer 13. The gate oxide layer 13 has one end on the p-type doped region 11 and the other end on the n-type drift region 12.

Figure 3C:
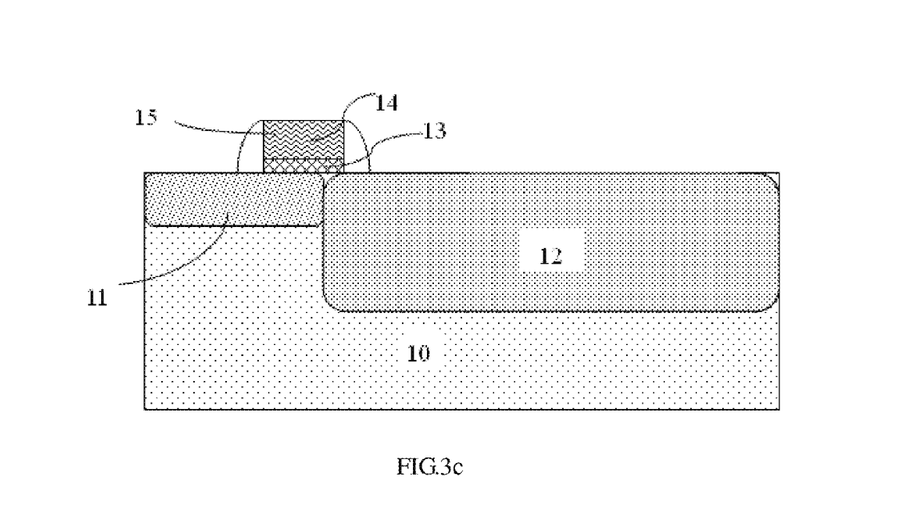

In a third step, as shown in FIG. 3c, a layer of a dielectric material, for example, silicon nitride, is deposited over the resulting structure after the second step. Next, undesirable portions of the layer are removed by a dry etching process and the remaining portions form sidewalls 15 on both sides of the gate oxide layer 13 and the polysilicon gate 14.

Figure 3D:
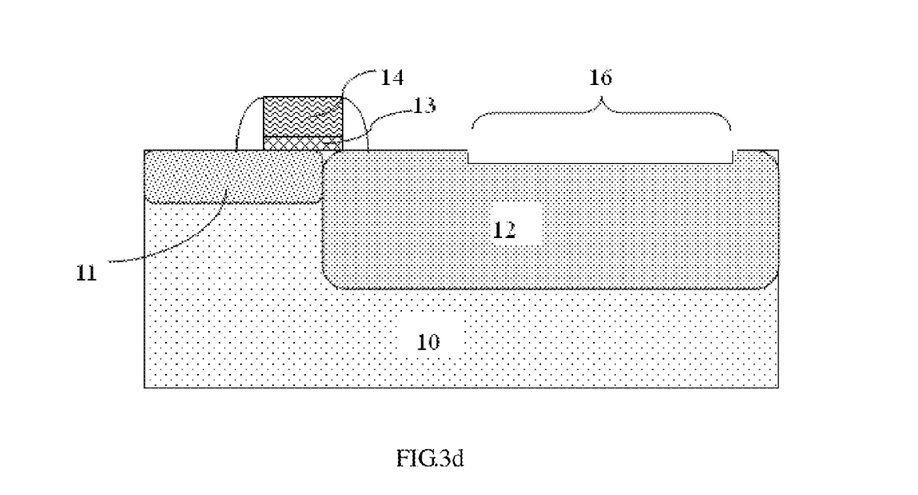

In a fourth step, as shown in FIG. 3d, an etching and photolithography process is performed on the n-type drift region 12 to form a first trench 16 therein. An end of the first trench 16 that is nearer to the gate oxide layer 13 may be in close proximity to the sidewall 15 closer to the n-type drift region 12 (i.e. the sidewall on the right in the figure) or a certain distance away from the sidewall 15. Moreover, the other end of the first trench 16 (i.e., the end that is farther from the gate oxide layer 13) may be in close proximity to a border of the n-type drift region 12 or a certain distance away from the border of the n-type drift region 12.

Figure 3E:
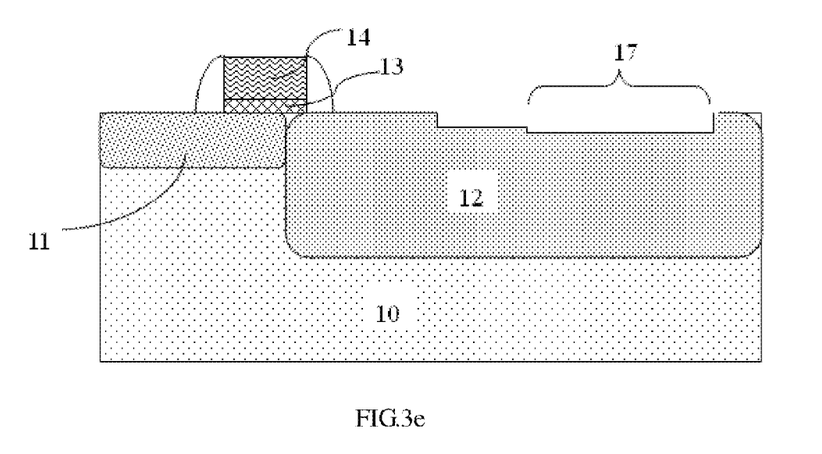

In a fifth step, as shown in FIG. 3e, a second etching and photolithography process is performed in the first trench 16 to form a second trench 17 therein at the end of the first trench 16 that is farther from the gate oxide layer 13. The second trench 17 may be narrower than the first trench 16.

Figure 3F:
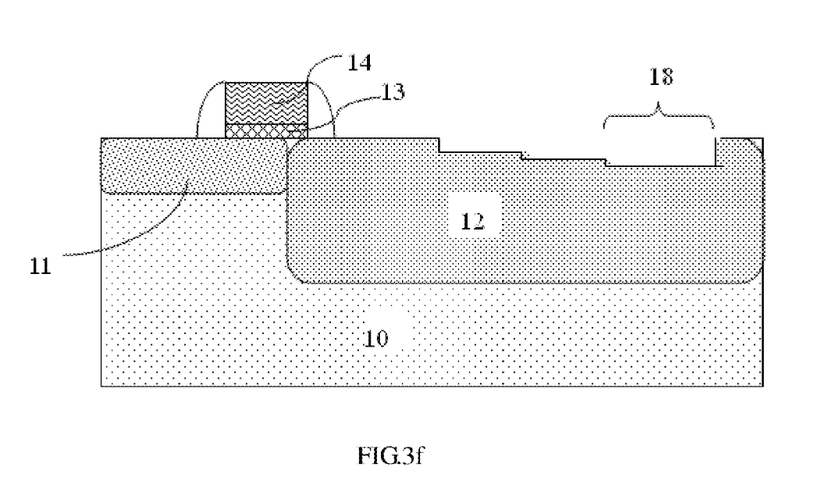

In a sixth step, as shown in FIG. 3f, a third etching and photolithography process is performed in the second trench 17 to form a third trench 18 therein at the end of the second trench 17 that is farther from the gate oxide layer 13. The third trench 18 may be narrower than the second trench 17.

With further reference to FIG. 2a, in a seventh step of the method, an ion implantation process is performed on a portion of the p-type doped region 11 that is in close proximity to the sidewall 15 to form a heavily doped n-type source region 19 therein. Next, an annealing process is performed to cause the heavily doped n-type source region 19 to diffuse into a central portion of the p-type doped region 11. As such, one end of the gate oxide layer 13 is on the heavily doped n-type source region 19. Moreover, a region between the heavily doped n-type source region 19 and the n-type drift region 12, under the gate oxide layer 13, serves as a channel of the LDMOS device being fabricated.

After that, an ion implantation process is performed at an end of the n-type drift region 12 that is farther from the gate oxide layer 13 to form a heavily doped n-type drain region 20 therein.

Moreover, an ion implantation process is performed at an end of the p-type doped region 11 that is farther from the gate oxide layer 13 to form a heavily doped p-type channel pick-up region 21 therein.

Preferably, both the heavily doped source region 19 and the heavily doped drain region 20 have a dopant concentration of greater than $1 \times 10^{20}$ atoms/cm$^3$. Moreover, the heavily doped channel pick-up region 21 may have the same dopant concentration with the above two regions 19, 20.

The three etching processes in the above fourth to sixth steps of the method have shaped the top surface of the drift region into a step-like shape. However, the present invention is not limited to this. A step-like top surface with a different number of step portions may also be formed by using a different number of etching processes.

Although the sidewalls are formed in the third step before the fourth to sixth steps in this embodiment, the present invention may also be employed with the sidewalls formed after, or even among, the fourth to sixth steps.

As described above, each implantation process in the first step and the implantation process in the seventh step are both followed by an annealing process. Preferably, each annealing process in the first step is a high-temperature oven annealing process and the annealing process in the seventh step is a rapid thermal annealing (RTA) process.

In one embodiment, a non-channel-isolated p-type LDMOS device in accordance with the present invention is fabricated by using and forming components and implanting ions, with types of conductivity opposite to their counterparts in the method described above. In another embodiment, a channel-isolated p-type LDMOS device in accordance with the present invention is fabricated by forming an n-well (not shown) in a p-type substrate 10 by ion implantation before the first step of the method for fabricating the non-channel-isolated p-type LDMOS device in the previous embodiment, forming an n-type doped region 11 and a p-type drift region 12 neighboring each other both in the p-well, and following all subsequent steps of the method.

In yet another embodiment, a channel-isolated n-type LDMOS device in accordance with the present invention is fabricated by forming an n-well (not shown) in the p-type substrate 10 by ion implantation before the first step of the method for fabricating the non-channel-isolated n-type LDMOS device described above, forming the p-type doped region 11 and the n-type drift region 12 neighboring each other both in the n-well, and following all subsequent steps of the method. In still yet another embodiment, a channel-isolated p-type LDMOS device in accordance with the present invention is fabricated by using and forming components and implanting ions, with types of conductivity opposite to their counterparts in the method for fabricating the channel-isolated n-type LDMOS device in the previous embodiment.

While preferred embodiments are described and illustrated above, they are not intended to limit the invention in any way. Those skilled in the art can make various alternatives, modifications and variations without departing from the scope of the invention. Thus, it is intended that the present invention embrace all such alternatives, modifications and variations as fall within the true scope of the invention.

What is claimed is:

1. A laterally diffused metal oxide semiconductor (LDMOS) device comprising:
   a substrate having a first type of conductivity;
   a drift region having a second type of conductivity and being formed in the substrate;
   a doped region having the first type of conductivity and being formed in the substrate, the doped region being located at a first end of the drift region and laterally adjacent to the drift region;
   a heavily doped drain region having the second type of conductivity and being formed in the substrate, the heavily doped drain region being located at a second end of the drift region;
   a gate oxide layer and a gate both on a top surface of the substrate, the gate oxide layer covering a portion of the drift region and a portion of the doped region;
   sidewalls on both sides of the gate oxide layer and the gate; and
   a heavily doped source region having the second type of conductivity and a heavily doped channel pick-up region having the first type of conductivity both formed in the doped region, the heavily doped channel pick-up region being located at an end of the source region farther from the drift region,
   wherein the drift region has a step-like top surface with at least two step portions, and wherein a height of the at least two step portions decreases progressively in a direction from the doped region to the drain region.

2. The LDMOS device according to claim 1, wherein the first and second types of conductivity are p-type and n-type, respectively, or n-type and p-type, respectively.

3. The LDMOS device according to claim 1, wherein an outer edge of a lowest step portion of the drift region is aligned with an inner side of the drain region, wherein a top surface of a highest step portion of the drift region is at a same level with a top surface of the drain region, and wherein a top surface of the lowest step portion of the drift region is at a same level with or at a higher level than a bottom surface of the drain region.

4. The LDMOS device according to claim 1, wherein an outer edge of a lowest step portion of the drift region is aligned with an outer side of the drain region, and wherein a top surface of the lowest step portion of the drift region is at a same level with a top surface of the drain region.

5. The LDMOS device according to claim 1, wherein a border line between a highest and a second highest step portions of the drift region is aligned with an outer side face of the sidewall closer to the drift region.

6. The LDMOS device according to claim 1, wherein a border line between a highest and a second highest step portions of the drift region is a certain distance away from an outer side face of the sidewall closer to the drift region.

7. The LDMOS device according to claim 1, wherein a doping concentration of the drift region is proportional to a distance from a border line between a highest and a second highest step portions of the drift region to the drain region and is also proportional to a height difference between the highest and a lowest step portions of the drift region.

8. A method of fabricating a laterally diffused metal oxide semiconductor (LDMOS) device, comprising the steps of:
   providing a substrate having a first type of conductivity;
   forming a drift region having a second type of conductivity in the substrate;
   forming a doped region having the first type of conductivity in the substrate, the doped region being located at a first end of the drift region and laterally adjacent to the drift region; and
   forming a heavily doped drain region having the second type of conductivity in the substrate, the heavily doped drain region being located at a second end of the drift region,
   wherein the drift region has a step-like top surface with at least two step portions, and wherein a height of the at least two step portions decreases progressively in a direction from the doped region to the drain region,
   the method further comprising the steps of:
   1) forming, in the substrate having the first type of conductivity, a doped region having the first type of conductivity and a drift region having the second type of conductivity which are laterally adjacent to each other;

2) successively forming a gate oxide layer and a polysilicon gate on a top surface of the substrate, the gate oxide layer covering a portion of the drift region and a portion of the doped region;
3) performing at least one etching process on the drift region to make the drift region have a step-like top surface;
4) forming a heavily doped source region having the second type of conductivity in a central portion of the doped region;
5) forming a heavily doped drain region having the second type of conductivity at an end of the drift region farther from the gate oxide layer; and
6) forming a heavily doped channel pick-up region having the first type of conductivity at an end of the doped region farther from the gate oxide layer.

9. The method according to claim 8, wherein the first and second types of conductivity are p-type and n-type, respectively, or n-type and p-type, respectively.

10. The method according to claim 8, wherein in the step 1), multiple ion implantation and annealing processes are carried out to form a dopant concentration gradient in the drift region decreasing from the top down.

11. The method according to claim 8, further comprising, before the step 1), forming a well having the second type of conductivity in the substrate, and wherein in the step 1), the doped region having the first type of conductivity and the drift region having the second type of conductivity are both formed in the well.

12. The method according to claim 8, wherein the drift region has a dopant concentration of $1\times10^{16}$ atoms/cm$^3$ to $1\times10^{18}$ atoms/cm$^3$, and wherein both the heavily doped source region and the heavily doped drain region have a dopant concentration of greater than $1\times10^{20}$ atoms/cm$^3$.

13. The method according to claim 8, further comprising, between the steps 2) and 3), forming sidewalls on both sides of the gate oxide layer and the polysilicon gate.

14. The method according to claim 13, wherein a border line between a highest and a second highest step portions of the drift region formed by the at least one etching process in the step 3) is aligned with an outer side face of the sidewall closer to the drift region.

15. The method according to claim 13, wherein a border line between a highest and a second highest step portions of the drift region formed by the at least one etching process in the step 3) is a certain distance away from an outer side face of the sidewall closer to the drift region.

16. The method according to claim 8, further comprising, between the steps 3) and 4), forming sidewalls on both sides of the gate oxide layer and the polysilicon gate such that an outer side face of the sidewall closer to the drift region is aligned with, or a certain distance away from, a border line between a highest and a second highest step portions of the drift region.

* * * * *